United States Patent
Tzu et al.

(10) Patent No.: US 6,632,590 B1
(45) Date of Patent: Oct. 14, 2003

(54) ENHANCE THE PROCESS WINDOW OF MEMORY CELL LINE/SPACE DENSE PATTERN IN SUB-WAVELENGTH PROCESS

(75) Inventors: San-De Tzu, Taipei (TW); Tsung-Hou Lee, Taipei (TW); Chih-Hsiung Lee, Hsin-Chu (TW); Gwo Yuh Shiau, Hsin-Chu (TW); Ching-sen Kuo, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 73 days.

(21) Appl. No.: 09/617,010

(22) Filed: Jul. 14, 2000

(51) Int. Cl.$^7$ .............................. G03F 7/00; H01L 21/00
(52) U.S. Cl. ...................... 430/311; 430/313; 430/330; 438/637
(58) Field of Search ................... 430/311, 313, 430/315, 317, 330; 427/487

(56) References Cited

U.S. PATENT DOCUMENTS

| | | | |
|---|---|---|---|
| 3,779,806 A | 12/1973 | Gipstein et al. | 117/212 |
| 5,096,802 A * | 3/1992 | Hu | 430/328 |
| 5,573,890 A * | 11/1996 | Spence | 430/311 |
| 5,858,620 A | 1/1999 | Ishibashi et al. | 430/313 |
| 5,955,227 A | 9/1999 | Tsujita et al. | 430/30 |
| 5,958,656 A | 9/1999 | Nakao | 430/394 |
| 6,284,438 B1 * | 9/2001 | Choi | 430/322 |
| 6,319,853 B1 * | 11/2001 | Ishibashi | 438/780 |
| 6,348,301 B1 * | 2/2002 | Lin | 430/330 |
| 6,486,058 B1 * | 11/2002 | Chun | 438/637 |
| 6,489,085 B2 * | 12/2002 | Huang et al. | 430/322 |
| 6,566,040 B1 * | 5/2003 | Sugino et al. | 430/313 |

OTHER PUBLICATIONS

"0.1um Level Contact hole Pattern Formation with KrF Lithographyby RELACS"□□T.Toyshima et al.□□IEDM iEEE, 1998, p333–336.*

* cited by examiner

Primary Examiner—Mark F. Huff
Assistant Examiner—Kripa Sagar
(74) Attorney, Agent, or Firm—George O. Saile; Stephen B. Ackerman

(57) ABSTRACT

A new method is provided for the creation of densely patterned interconnect lines. As a first step of the invention, the mask layout is modified such that the ratio of line width (L) to line spacing (S) is sharply decreased. The line pattern that is created using this mask reflects the same sharp reduction in the ratio L/S. The width of the thus created lines is, as a second step of the invention, increased by the process of thermal flow while the spacing between the lines is concurrently decreased by the same amount.

17 Claims, 6 Drawing Sheets

ENHANCE THE PROCESS WINDOW OF MEMORY CELL LINE/SPACE DENSE PATTERN IN SUB-WAVELENGTH PROCESS

BACKGROUND OF THE INVENTION (1) Field of the Invention

The invention relates to the fabrication of integrated circuit devices, and more particularly, to a method of increasing the dense-line processing window. This increase in the dense-line processing window most preferably to be applied to the creation of memory cells using a deep-ultra violet exposure process.

(2) Description of the Prior Art

The formation of semiconductor devices requires a number of different but cooperative technologies that are aimed at creating devices that meet functional specifications at a competitive cost. The formation of integrated circuits typically takes place on the surface of a semiconductor substrate and requires the deposition and formation of such disparate circuit components as resistors, transistors, diodes, capacitors and inductors. By interconnecting the various electrical components that constitute an electrically functioning unit, the semiconductor device is completed.

Conductive interconnect lines and interconnect vias and contact points form an important part of the creation of a semiconductor device. The conductive interconnects are mostly patterned in layers of dielectric and are separated by layers of insulator materials.

The semiconductor industry has, since its inception, been characterized by a relentless and seemingly never ending drive at improving device performance while keeping device manufacturing costs under competitive control. Improvements in device performance are mostly achieved by reductions in device size and device feature size, reductions that concurrently enhance and facilitate increased device packaging. Device interconnect lines have consequently also felt the impact of this continuous reduction in device dimensions. Current technology is therefore at the point where a line width of deep sub-micron values of as low as 0.1 $\mu$m is approached.

Conventional processes of creating interconnect lines and other circuit features require the exposure of patterns that are contained within for instance an optical mask, whereby these patterns are projected onto a target surface. This target surface can be a layer of photoresist, the surface of a substrate or the surface of any of the other layers of material that are used in the creation of semiconductor devices such as layers of dielectric or insulating material. With the decrease in interconnect size, the design and resolution capabilities of the exposure methods are placed under ever more stringent demands. Typical of these performance parameters of optical exposure systems are the minimum feature size that can be created using the system, the error that is incurred while performing the exposure, the uniformity of the exposure in the exposed surface, and qualities of the mask that is used that can result in errors of exposure such as the line size of the image on the mask and the size of the defect that can be allowed in the mask image while still creating high quality exposures. The indicated parameters are however not the only parameters that can be used to create ever finer interconnect line images. The source of radiation that is used for optical exposures has a given wavelength, current photolithographic exposure systems operate using near ultra violet (NUV) radiation with a wavelength of 365 nm. Using such a source of exposure allows for line width of about 0.35 um. For further decreases in line width, the wavelength of the radiation that is used to create the target image must be decreased leading to sources of exposure that operate in the deep ultra-violet (DUV) range with a wavelength of 254 nm. The DUV wavelength application allows for feature interconnect line widths down to about 0.18 um.

Semiconductor devices are typically fabricated by the creation of a multiplicity of conductive regions on the surface of a semiconductor substrate. These conductive regions are isolated from each other by dielectric layers that can contain dielectric materials such as silicon dioxide ("oxide") or silicon nitride ("nitride"), tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), and the like. Some of the dielectrics, such as silicon dioxide, can be grown on the surface of the substrate or can be physically deposited by for instance a sputtering process or by other chemical methods of dielectric deposition. The native properties of a dielectric can further be altered by doping the dielectric layer by either n-type dopants such as arsenic and phosphorous or p-type dopants such as indium or boron. The method of forming the dielectric layer and the doping that is applied to this layer is determined by various device and processing considerations.

To create interconnect lines in the various layers of dielectric that are applied in the structure of a semiconductor device, an interconnect line pattern must be created in the dielectric. This interconnect line pattern is filled with a metal that can contain aluminum, tungsten, titanium nitride, molybdenum, silicide and polysilicon but typically contains aluminum, tungsten, wolfram or copper. Openings are created that establish electrical contact between overlying layers of interconnect lines, these openings can be further differentiated between contact openings and via openings.

The process of creating an interconnect line pattern starts with the deposition of a layer of dielectric (the dielectric into which the interconnect pattern is to be created) over which a layer of photoresist is deposited. The layer of photoresist is patterned in accordance with the desired interconnect line pattern, the photoresist is removed from above the layer of dielectric in accordance with the pattern for the to be created interconnect lines. The dielectric layer is then etched, that is the dielectric is removed in accordance with the pattern of the interconnect lines. A dry etch is typically performed, exposing the dielectric layer to a plasma that is created by using one or more gasses that expose the surface of the oxide where the photoresist has been removed. To avoid distortion of the photoresist patterns that are used to create the interconnect lines on the dielectric layer, Anti Reflective Coating (ARC) is frequently applied over the surface of the opening.

Further innovation is required in the art of creating interconnect lines if these lines are to meet future requirements of device design and creation. The literature of the art contains a large number of proposals and inventions that apply to this field. These inventions may address specific aspects of the process of forming narrow lines, such as a method that is particularly applicable to forming lines within advanced Field Effect Transistors (FET's) whereby the line width can be as small as 0.25 um. Such a method of etching can use NUV (with a wavelength of 365 nm) photolithographic exposure and may make use of the available properties of a Anti-Reflective Coating (ARC). Other methods address the patterning of a particular layer of material by using NUV photolithographic exposure, for instance a layer of silicon nitride, to an aperture width of the etched openings of about 0.30 um, an application that holds particular promise for the formation of Field Isolation (FOX) regions in the surface of a substrate. The application of layers of ARC has in the literature on the subject also been treated extensively, such as for instance the use of silicon or silicon nitride that is interposed between a metal nitride ARC and an acidic functional photoresist layer.

The objectives of the above cited and other methods that address the formation of interconnect lines in the art can be summarized as follows:

the formation of interconnect lines that are as narrow as 0.1 urn by using Near Ultra Violet (NUV) photo exposure technology the design and application of methods that allow for the creation of narrow lines with line size down to 0.1 um, and the discovery and application of materials that allow for the creation of narrow lines down to a line width of 0.1 um.

U.S. Pat. No. 5,858,620 (Isihashi et al.), cited by the inventor, teaches a method for forming photoresist lines.

U.S. Pat. No. 5,955,227 (Tsujita et al.) shows a method of setting the interconnect width.

U.S. Pat No. 5,958,656 (Nakao) shows another phase shift mask (PSM) method.

U.S. Pat. No. 3,779,806 (Gipstein et al.) defines Mask Error Factor (MEF).

SUMMARY OF THE INVENTION

A principal objective of the invention is to provide a method of resolving line resolution when creating a variety of dense lines.

Another objective of the invention is to resolve problems of line resolution when creating dense lines whereby equal line spacings and adequate Depth Of Field for the exposed line pattern is assured.

Yet another objective of the invention is to provide a method of creating dense lines thereby taking advantage of a decreased Mask Error Factor of an applied Alternate Phase Shift Mask (APSM).

A still further objective of the invention is to provide a method that allows for the sizing or adaptation of layer design rules without affecting or changing device parameters.

A still further objective of the invention is to provide a method that assures that large changes in the mask chrome Critical Dimension will have a minimum impact on the image Critical Dimension thereby reducing the Mask Error Factor to close to zero.

A still further objective of the invention is to provide a method of creating dense lines that is aimed at allowing a smaller ratio of line spacing to line width (the duty ratio).

In accordance with the objectives of the invention a new method is provided for the creation of dense lines. As a first step of the invention, the mask layout is modified such that the ratio of line width (L) to line spacing (S) is sharply decreased. The line pattern that is created using this mask reflects the same sharp reduction in the ratio L/S. The width of the thus created lines is, as a second step of the invention, increased by the process of thermal flow whereby the spacing between the lines is concurrently decreased by the same amount.

BRIEF DESCRIPTION OF THE DRAWINGS

FIG. 3 shows a cross section of the deposition of a layer of Relacs, as follows:

FIG. 3a shows a cross section after a patterned layer of photoresist has been formed on the surface of a conducting material, FIG. 3b shows a cross section after a layer of Relacs has been deposited over the patterned layer of photoresist, FIG. 3c shows a cross section after the structure has been exposed to high temperature forming a cross-linked layer over the surface of the layer of photoresist, and FIG. 3d shows a cross section after the unreacted layer of Relacs has been removed.

DESCRIPTION OF THE PREFERRED EMBODIMENTS

Figure 1A:
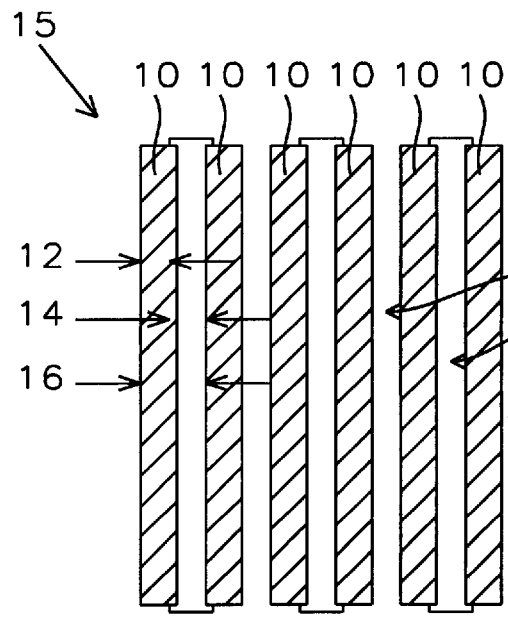
FIG. 1a shows a top view of the photolithographic mask prior to the reduction of the ratio L/S.

The invention addresses a method for forming narrow lines and, more particularly, problems of line resoluion that are encountered in the creation of dense lines. The invention solves the indicated problems of line resolution by first decreasing the ratio of line width to line spacing by retooling the mask that is used to make the line exposure. The retooling of the mask results in a mask with a sharply reduced line width and a significantly increased line spacing while keeping the line pitch the same. As a second step in the process of the invention, lines that have been created by the retooled mask and that now have considerably increased inter-line separation, can be made wider by applying a thermal reflow to the created lines or by applying Relacs materials to widen the created lines. The diameter of openings that are created in a layer of conductive material can also be reduced using the process of the invention.

Photolithographic masks are, as is well known in the art either of the type of Binary Mask (BIM) or of the type of Phase Shift Mask (PSM). The binary mask uses the opaque and translucent properties of the mask to create images of a binary (exposure or no exposure) on the target surface. The field of optical lithography is well documented and will be highlighted in this context in a very limited form and only where it directly applies to the invention. One of the ultimate and key requirements of creating images using methods of photolithography is the creation of sharply defined images where the geometric parameters that determine these images are well defined. For the era of deep sub-micron devices these requirements are even more difficult to realize in a high speed, high volume manufacturing environment. Two of the main parameters that can be adjusted to achieve the above stated objective are the wavelength of the light source that is used in the system and the depth of focus (DOF) that is characteristic of the photolithographic system. The impact of the wavelength has already been discussed, where essentially higher source frequencies (or smaller source wavelengths) are used for finer and narrower line resolutions. A well-controlled and small DOF parameter is required in order to achieve the same objective of being able to create narrow lines of high density. One of the techniques that has thereby been applied is the application of the phase-shifting mask (PSM). It is well known in the art that the phase-shifting mask, due to the cancellation effect of the electrical field that is introduced by the mask in adjacent regions of the exposed surface, allows for the projection of images that are closer spaced than other techniques allow. The PSM therefor has better depth of focus of the exposed image than the BIM. One of the parameters by which the performance of the image projecting system is measured is the Mask Error Factor (MEF), which is the ratio of the change in the image critical dimensions to the change in the mask chrome critical dimensions. It is-clear that this ratio should be as small as possible and ideally approach zero. For binary masks that project dense and isolated lines (small feature sizes) the MEF quickly exceeds 1.0, which is very detrimental to the creation of the lines. It is the advantage of the Alternate Phase Shift Mask (APSM) technique that the MEF when applying APSM is significantly smaller than 10 for dense patterns of lines that in addition have narrow line width. This characteristic of the APSM follows from the very principle on which the phase-shift technology is based and which has been highlighted above.

The parameter of duty ratio, which is the ratio of line width (L) over line spacing (S), has previously been referred to. It is the objective of the first step of the invention to significantly decrease this duty ratio, an objective that is achieved by changing the dimensions of the photolithographic mask, whereby the dimension L is reduced and the dimension of S is increased while the line spacing or pitch is left unmodified.

Referring now specifically to FIG. 1a, there is shown a top view of the photolithographic mask 15 prior to the reduction of the ratio L/S. The opaque features of the mask 15 are highlighted as areas 10, the line width (L) of the lines 10 whose images are contained in the mask 15 are highlighted as parameter 12, parameter 14 is the line spacing (S), parameter 16 is the line pitch. It is clear from FIG. 1a that the line width L is the lateral distance of the surface of the line as measured in a direction that is perpendicular to the longitudinal direction of the lines 10, the line spacing S is the distance between adjacent lines again as measured in a direction that is perpendicular to the longitudinal direction of the lines 10 while the line pitch P equals the sum L+S. The top view that is shown in FIG. 1a is a top view of lines whereby the dimensions for L and S are equal, indicating that the line density is high. The duty cycle as previously defined is, for the lines that are shown in top view in FIG. 1a, equal to one (1). In actual numbers for the lines that are shown in top view in FIG. 1a the parameters are as follows: P=0.26 um, L/S=0.13/0.13=1.

It has previously been pointed out that the process of the invention applies APSM technology, this can be further highlighted by pointing out that the electromagnetic field in alternating translucent fields are 180 degrees out-of phase. For instance the electromagnetic field for region 18 is 180 out-of phase with the electromagnetic field of region 20. This applies to alternating translucent regions of the mask 15. Regions 22 represent the chrome regions of the mask.

It must be remembered that the lines that are to be created in the target surface underlie the regions 22 of chrome of the mask. The photoresist that is used for the creation of the line pattern is of the type that becomes susceptible to being removed after exposure by a source of energy, that is, in the example shown in FIG. 1a, in regions that are in between the chrome regions 10. By removing the photoresist in the exposed regions, the photoresist remains in place underneath the opaque regions 10. The subsequent etch of the underlying metal therefore removes the metal in accordance with the pattern of the photoresist layer that is interstitial with the pattern of the chrome regions 10 of the mask, thereby leaving the metal lines in place underlying the chrome regions 10.

Figure 1B:
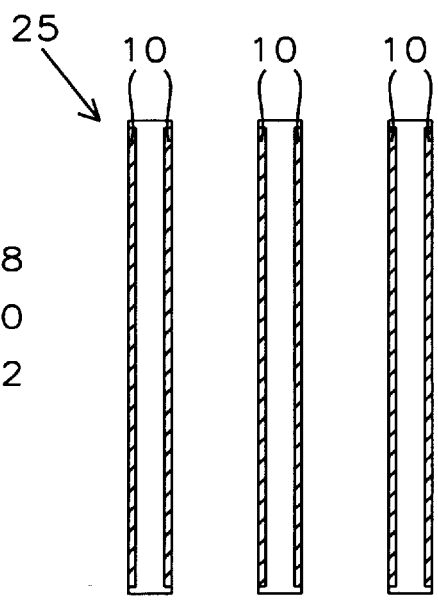
FIG. 1b shows a top view of the photolithographic mask after the ratio L/S has been sharply reduced.

This latter observation is of importance when considering the top view that is shown in FIG. 1b. FIG. 1b shows a top view 25 of the photolithographic mask after the ratio L/S has been sharply reduced. The top view of the mask that is shown in FIG. 1b has the following dimensions: L=0.075 um, S=0.185 um while the pitch for the line pattern has remained the same at 0.26 um. The lines that will therefore be created using the mask that is shown in top view in FIG. 1b will have a pattern of metal lines (underlying the chrome regions 10) consisting of much narrower lines (L=0.075 um) with considerable larger spacing between the lines (S=0.185) while the repetition of the line pattern in a lateral direction as expressed by the pitch of the lines has remained the same (P=0.26).

The basic characteristic of the Alternate Phase Shift Mask (APSM) can be applied under the invention using the mask image that has been created by sizing mask feature sizes and dimensions as shown in FIG. 1b to create images in a semiconductor surface. The characteristic and previously highlighted cancellation of electromagnetic fields in narrowly adjacent fields continues to take place and thereby allows the creation of narrowly spaced lines.

Figure 2A:
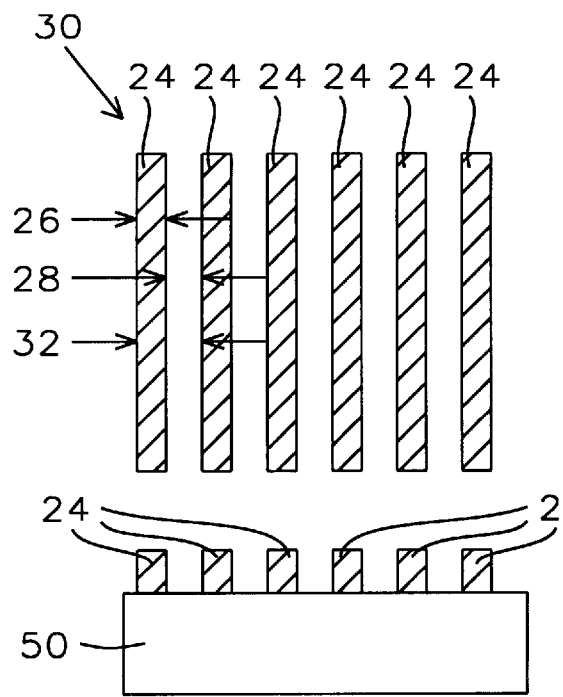
FIG. 2a shows a top view of a pattern of dense lines that has been created in a semiconductor surface whereby this pattern is created using the mask that is shown in top view in FIG. 1b that has the sharply reduced ratio of L/S.
Figure 2B:
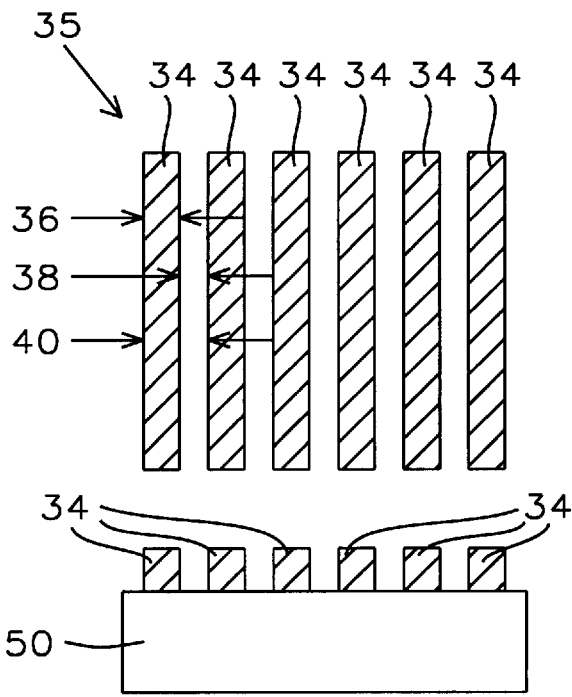
FIG. 2b shows a top view of the pattern of dense lines of FIG. 2a after the width of these lines has been increased by a process of thermal reflow.

FIGS. 1a and 1b have addressed the images that are constructed in the photolithographic mask that is used under the invention for the creation of a pattern of high-density lines. FIGS. 2a and 2b address the images that the mask of FIG. 1b will create on the surface of a semiconductor wafer.

FIG. 2a shows a top view of a pattern 30 of dense lines that has been created in a semiconductor surface whereby this pattern is created using the mask that is shown in top view in FIG. 1b. Lines 24 are created on the surface of a substrate 50 and have as dimensions a first parameter 26 of line width L=0.10 um, a second parameter 28 of line spacing S=0.16 um, and a third parameter 32 of line pitch P=0.26 um. These parameters differ from the parameters of the photo mask that is shown in FIG. 1a. The parameters of the pattern shown in top view in FIG. 1a are also the desired parameters of the pattern of lines that is to be created on the surface of the substrate 50. The line pattern that is shown in FIG. 2a has the desired line pitch but the lines are slightly narrower (than desired) and spaced apart slightly further (than desired) By therefore making the line width slightly larger, the line width can be increased to the desired line width while bringing the lines closer together by the amount of the increase of the line width. The line width can be changed by the process of thermal reflow of the substrate on which lines have been created or by the deposition and cross-linking of a layer of Relacs. The results of this reflow/Relacs cross-linking are shown in top view 35 in FIG. 2b. The lines 34 that are shown in FIG. 2b have as dimensions a first parameter 36 of line width L=0.13 um, a second parameter 38 of line spacing S=0.13 um, and a third parameter 40 of line pitch P=0.26 um. These parameters are identical to the parameters of the photo mask that is shown in FIG. 1a.

FIG. 3 shows the application of a layer of Relacs agent and the results that this application has on the CD of the created lines. Relacs materials AZ R2000 are commercially available agents that are instrumental in achieving photoresist reflow, as shown in FIG. 3. The purpose of this application of Relacs materials AZ R2000 is to further reduce line width by reducing the opening in the layer of overlying photoresist that is used to create the line pattern.

Figure 3A:
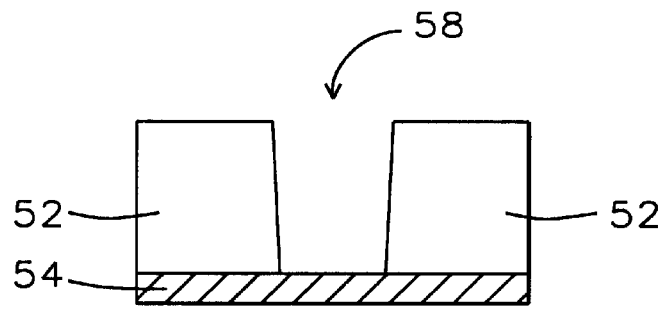
FIGS. 3a through 3d show cross sections of the deposition of a layer of Relacs, as follows.
Figure 3B:
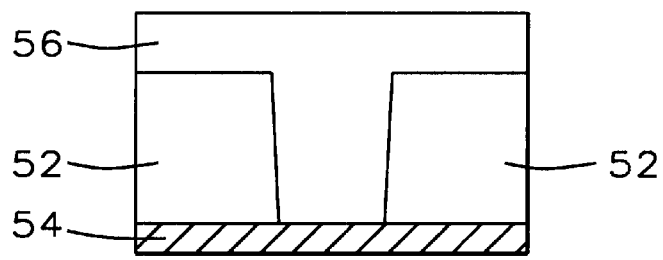
Figure 3C:
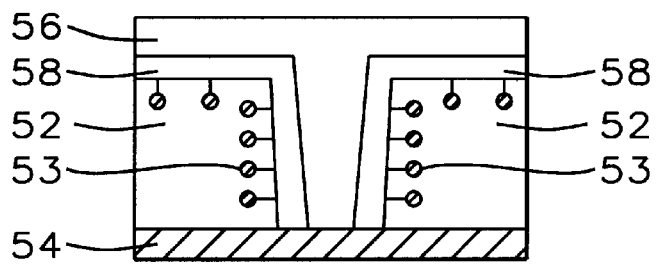
Figure 3D:
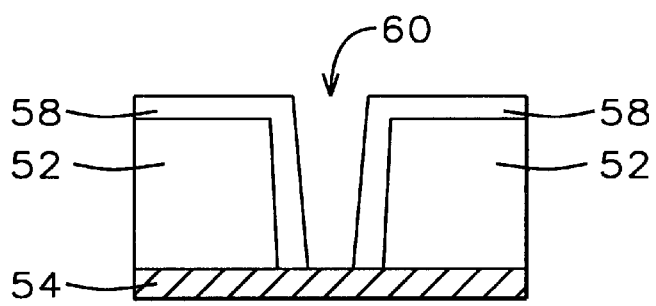

FIG. 3a shows a cross section of a patterned layer 52 of photoresist that has been deposited on a layer 54, typically a layer of conducting material. The exposed surface of layer 54, which is the bottom of the opening 58 that has been patterned in layer 52, is the region where the line is to be created. FIG. 3b shows a cross section after a layer 56 of Relacs has been deposited over the surface of layer 52 of photoresist thereby including the opening 58. The layer 56 of Relacs that has been deposited completely and homogeneously fills opening 58 and further overlays the surface of layer 52 of photoresist. By baking the structure of the layer 56 of Relacs (that is deposited over the interface between the layer 56 of Relacs and the layer 52 of photoresist) cross-linking is established-whereby acid 53 (FIG. 3c) from the layer 52 of photoresist combines with the Relacs of layer 56 and forms layer 58. It is clear from the cross section that is shown in FIG. 3c that the diameter of opening 58 has been reduced by twice the thickness of the cross linked layer 58. The removal of the unreacted Relacs, see FIG. 3d, therefore results in an opening 60 in the layer of photoresist that is considerably narrower than opening 58, thereby being able to etch a considerably narrower-line in the surface of layer 54.

The reduction in the width of openings 60 means a corresponding increase of the (protective) layer 52 of photoresist. The conductive material 54 will be etched away at the bottom of opening 60, and, with a narrower opening 60, less conductive material will be etched away, which is another way of saying that the (remaining) conductive lines are wider and are correspondingly spaced closer together. This effect has previously been indicated by comparing the top views that are shown in FIGS. 2a and 2b of the lines that are created following the process of the invention.

Figure 4:
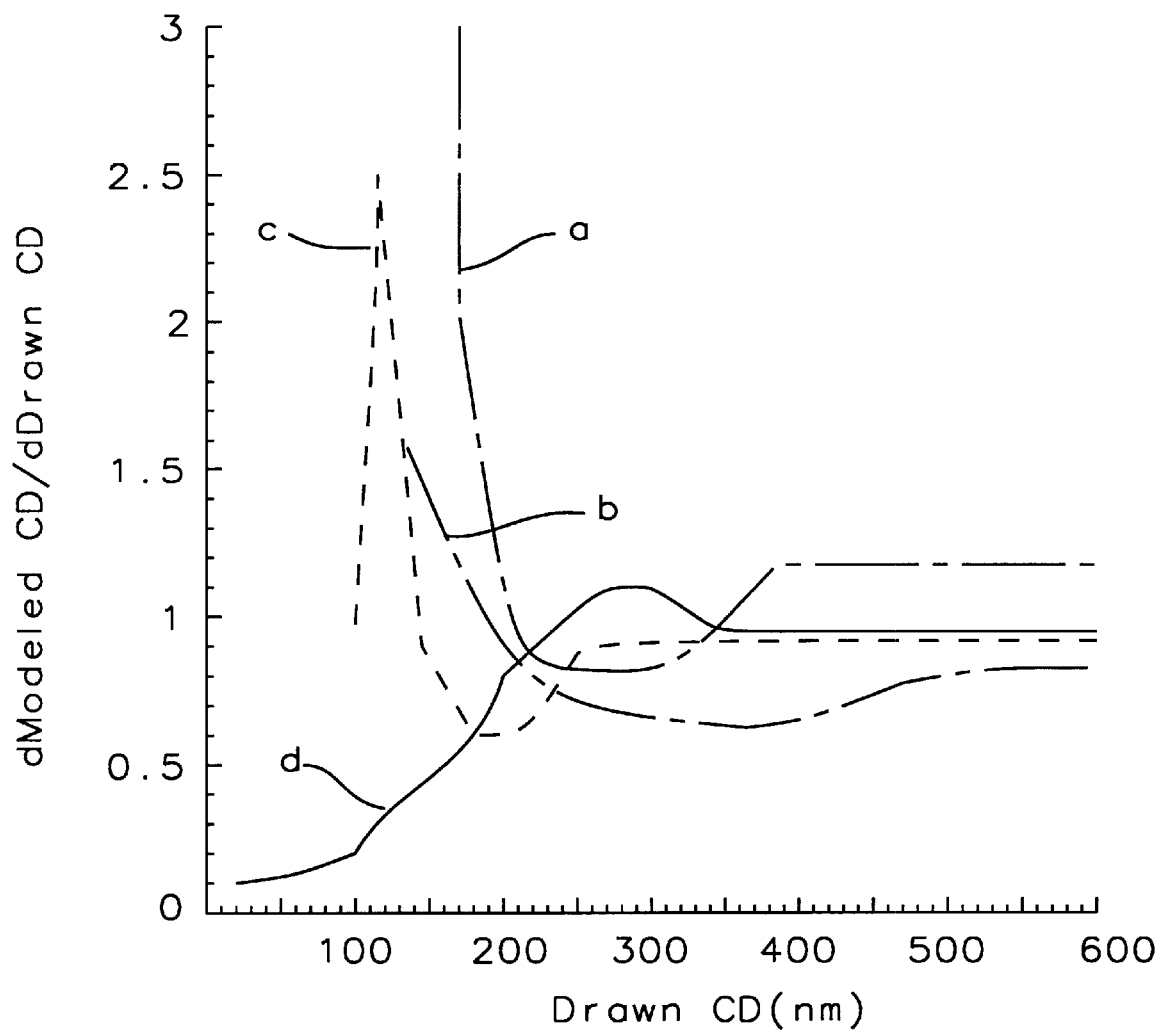
FIG. 4 shows the results of a study that has compared BIM with APSM technologies in creating interconnect lines of very small CD.

A number of experiments and simulations have been performed that were aimed at deriving and confirming the approaches of the invention. These experiments and simulations will be described below, whereby the overall conclusion of the data that have been collected as a result is that the approach of the invention is valid and leads to the desired results as stated above in the objectives of the invention, FIG. 4 shows the results of a study that has compared BIM with APSM technologies in creating lines of very small CD. This study was performed under conditions of NA=0.6 and sigma=0.5, conditions that were not altered during the analysis. The study has been conducted for two different line densities (duty cycles), that is L/S=1/1 and L/S=100. The results of this analysis indicate that, for the BIM technology, where line width approaches or goes below about 200 nm, the MEF for the created pattern increased sharply. For the APSM technology however and under identical conditions of evaluation with the line width as the independent parameter, where the line width approaches or is less than about 150 to 200 nm, the MEF for the created pattern drops in value and approaches zero. This confirms another tenet of the invention, which is that the APSM technology is superior over the BIM technology for the creation of very dense lines.

The specific conditions that applied for the four curves that are shown in FIG. 4 are as follows:

| curve | L/S | technology | NA | sigma |
|-------|-------|------------|-----|-------|
| a | 1:1 | BIM | 0.6 | 0.5 |
| b | 1:100 | BIM | 0.6 | 0.5 |
| c | 1:1 | PSM | 0.6 | 0.5 |
| d | 1:100 | PSM | 0.6 | 0.5 |

Figure 5:
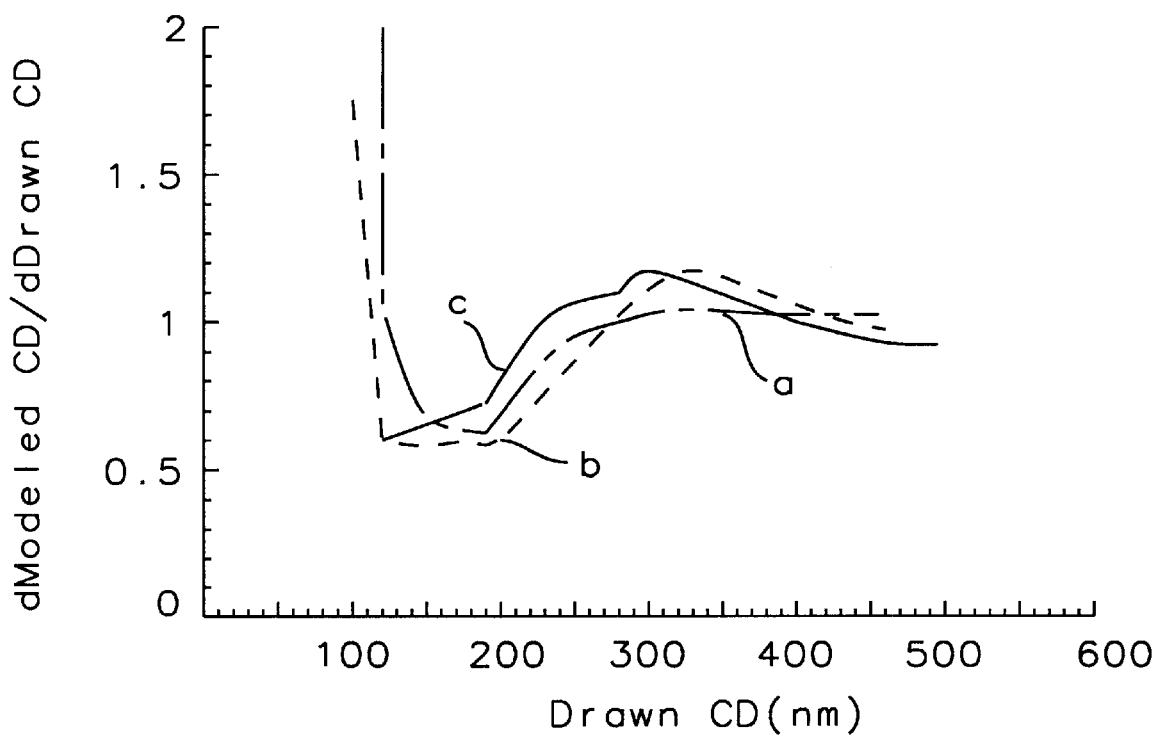
FIGS. 5 and 6 show the results of a study that has evaluated the impact of the application of the invention on the creation of dense versus isolated lines.
Figure 6:
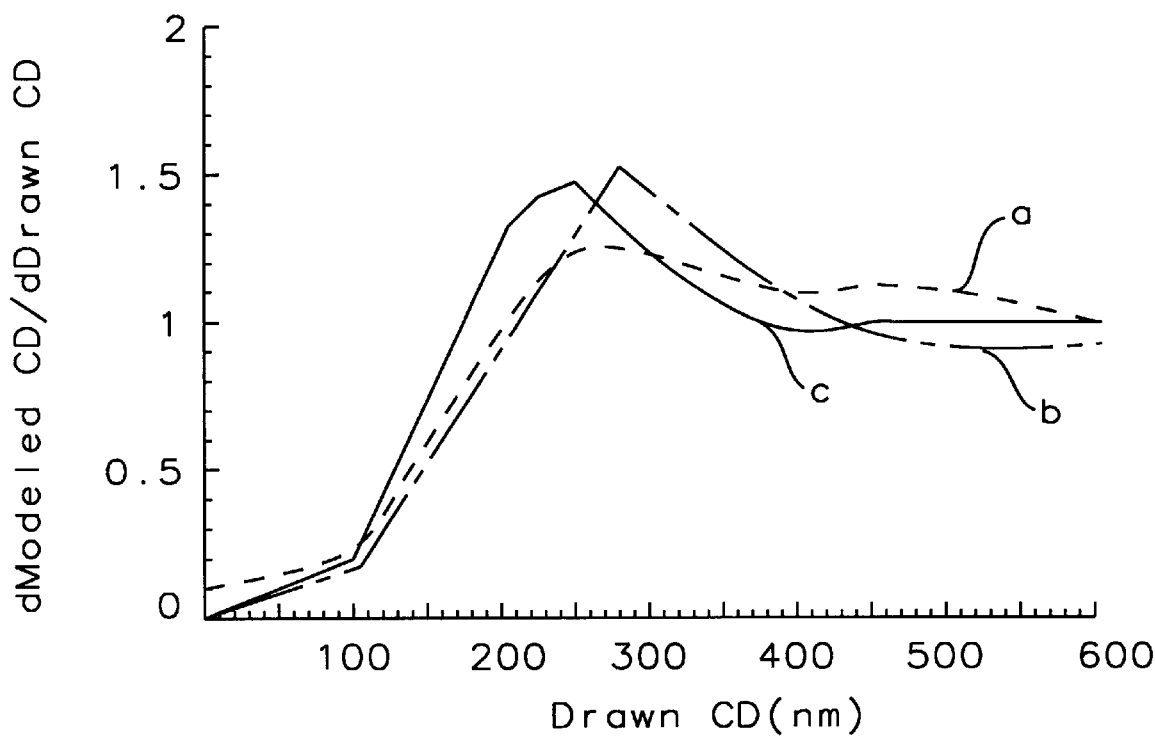

FIGS. 5 and 6 show the results of a study that has evaluated the impact of the application of the invention on the creation of dense versus isolated lines. With the line width the independent variable, the MEF has been evaluated for a dense pattern of lines and for isolated lines. The results of this analyses show that for isolated lines and applying the APSM technology, the MEF for the lines decreases rapidly after the line width has reached a value of about 300 nm from if the line width is further reduced. For the dense lines, the MEF value increases after this value has reached about 100 nm. This shows that the method of the invention applies to improving the creation of isolated lines whereby the invention further improves the creation of a dense pattern of lines as long as these lines are, for the conditions applied, less than about 100 nm in width. These experiments have been performed under conditions of NA=0.6, sigma 0.5; NA=0.6 and sigma=0.3 and NA=0.7, sigma=0.3. The results under all three conditions of experiments have found to be identical.

FIG. 5 addresses the MEF for a dense pattern of lines. The specific conditions that apply for the three curves that are shown in FIG. 5 are as follows:

| curve | L/S | technology | NA | sigma |
|-------|-------|------------|-----|-------|
| a | 1:1.2 | PSM | 0.6 | 0.5 |
| b | 1:1.2 | PSM | 0.6 | 0.3 |
| c | 1:1.2 | PSM | 0.7 | 0.3 |

FIG. 6 addresses the MEF for isolated lines. The specific conditions that apply for the three curves that are shown in FIG. 5 are as follows:

| curve | L/S | technology | NA | sigma |
|-------|-------|------------|-----|-------|
| a | 1:100 | PSM | 0.6 | 0.5 |
| b | 1:100 | PSM | 0.6 | 0.3 |
| c | 1:100 | PSM | 0.7 | 0.3 |

Figure 7:
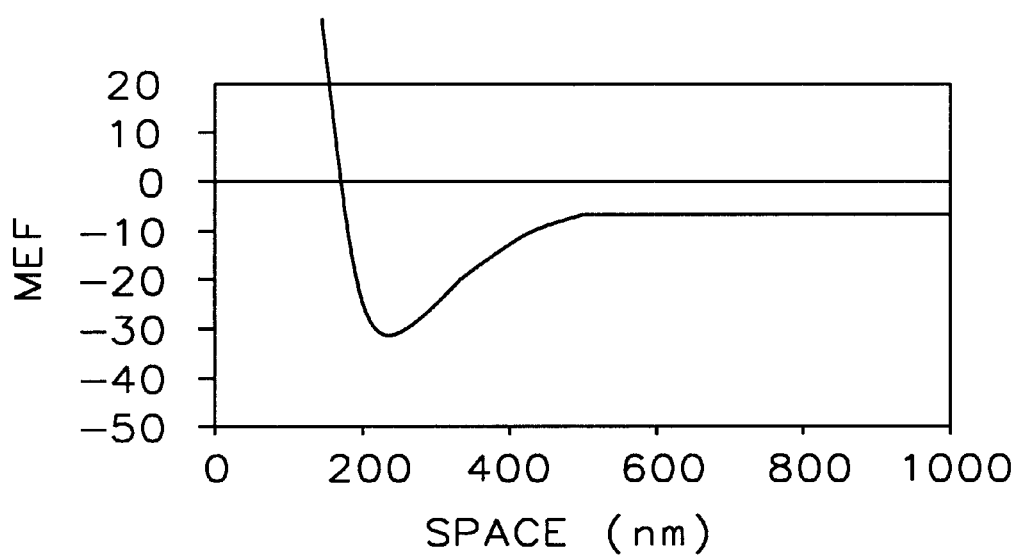
FIG. 7 shows, for a given and fixed line width, the effects of decreasing the spacing between lines.

FIG. 7 shows how, for a given and fixed line width of 140 nm, the effect that decreasing the spacing between lines (or the line pitch) has using the APSM method. Reducing the line spacing from an original value of 1000 nm in increments of 200 nm initially has no impact on the simulated value of MEF. Where the line spacing approaches a value of between 400 and 600 nm a slight decrease in the value of MEF is found after which the value for MEF rapidly and asymptotically increases to very large values. This confirms one of the tenets of the invention, which is that smaller line spacing (a high density line pattern) while keeping all other line dimensions the same results in reduced impact of mask error on the dense lines that are being created.

Figure 8:
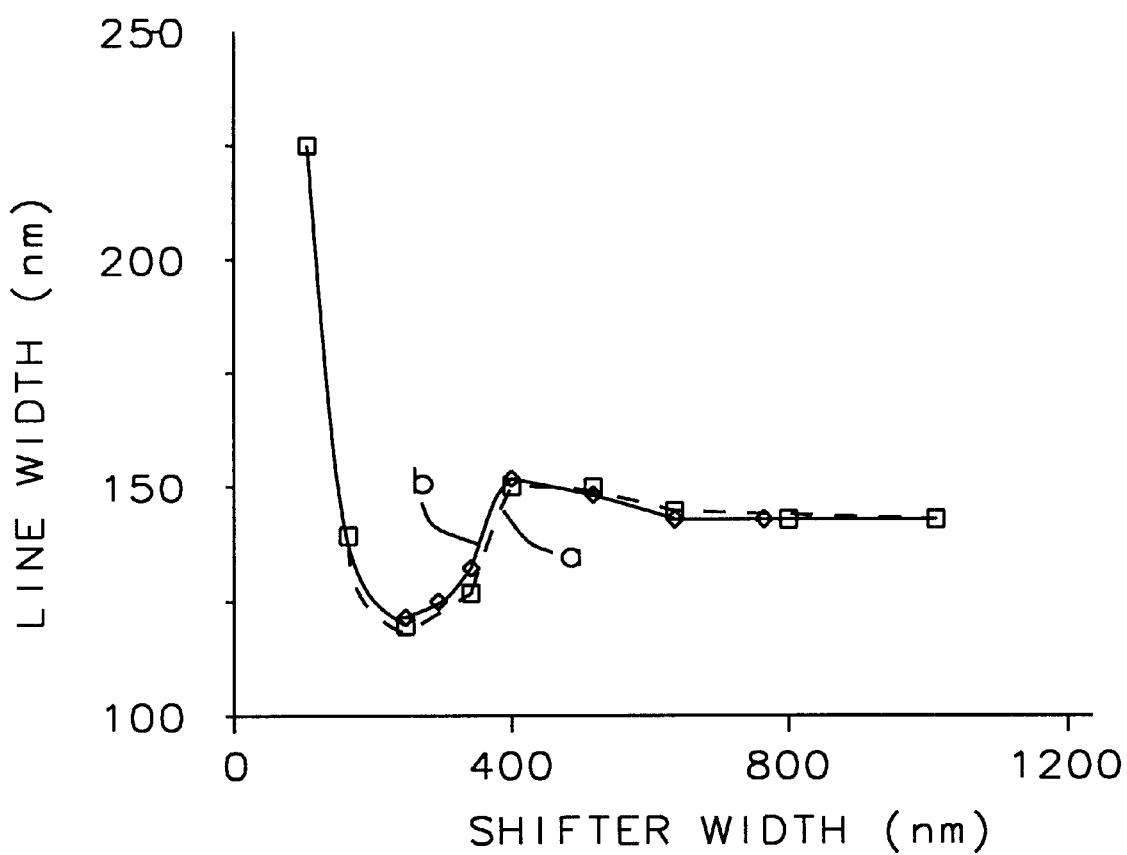
FIG. 8 shows the effect that the phase shifter has on the process of creating lines using the APSM technology.

FIG. 8 represents a further study, which has evaluated the effect that the phase shifter has on the process of creating lines using the APSM technology. During this series of experiments, the height of the phase shifter was kept constant at 10 um, the width of the phase shifter was varied. The line width of the lines was observed as a function of the variation in phase shifter width. By increasing the phase shifter width (increasing the chrome spacing in the mask) from very small values (about 100 nm) in 400 nm increments, the line width that can be created using the low and incrementally increasing values of the width of the phase shifter dramatically decreases. By referring back to FIG. 1b, the wider spacing S between the lines 10 means that the width of the phase shifter can be increased thereby allowing for a considerable reduction in the line width that can be created using the larger S value mask. Where the phase shifter approaches a width value of about 600 nm, the width of the lines that can be created with this mask can no further be reduced. This confirms one more tenet of the invention, which is that by creating larger openings between the chrome of the mask, the lines that are created using this mask can be considerably reduced in width. FIG. 8 shows the results that have been obtained for both solid-C (curve a) and for Optissimo (curve b). Solid-C is a simulation tool that is used for photo patterning, Optissimo is a software support package.

Further experiments have been conducted to evaluate the impact of higher baking temperatures on photoresist, no graph is presented that shows the results of these experiments. An opening has for this purpose been created in a layer of photoresist, the diameter of this opening has been evaluated while the layer of photoresist has been exposed to progressively higher baking temperatures varying from 120 degrees C. to 130 degrees C. in five incremental steps of 2 degrees C. each, with a condition of non-bake preceding the experiment. Each bake lasting 90 seconds. The total of six conditions that have been observed in this manner showed a gradual and progressive decrease in the diameter of the opening that has been created in the layer of photoresist, with the following measured values: 241 nm (for the no-bake condition), 231 nm, 193 nm, 161 nm, 107 nm and 41 nm. This experiment further confirms the invention in being able to progressively create openings of smaller diameter dependent on post-exposure conditions of photoresist bake.

Figure 9:
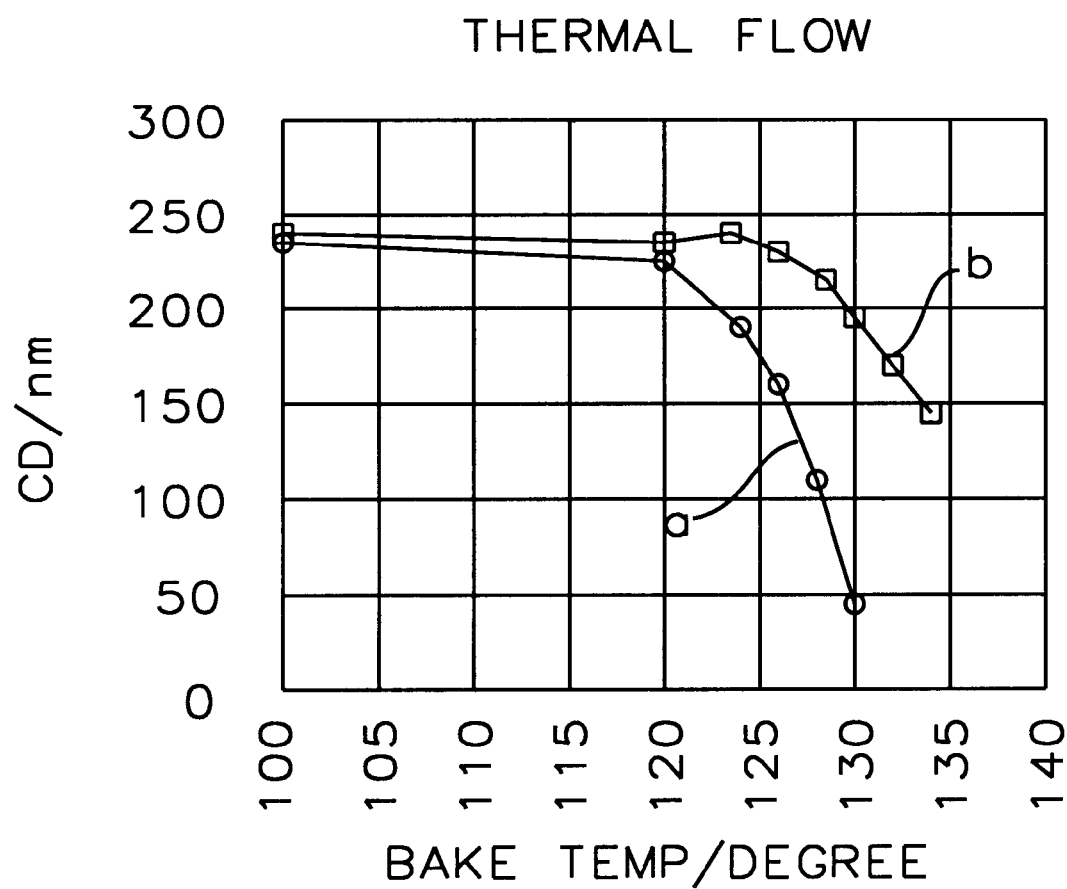
FIG. 9 shows the rate of change of the critical dimension of the diameter of an opening.

FIG. 9 shows the rate of change of the critical dimension of the diameter of the opening of the previous experiment, this to study the range of temperatures that needs to be applied during the post exposure bake. This analysis indicates that at a temperature of between about 100 and 120 degrees C., the CD of the observed opening remains essentially unchanged. At a post-bake temperature between about 120 degrees C. and 130 degrees C., the CD of the observed opening decreases from about 240 nm to about 50 nm for one sample and from about 240 nm to about 140 nm for a second sample. This confirms that the process of post-bake can effectively be used to reduce the CD of the lines that are being created. The two curves that are shown in FIG. 9 represent DP-410 (curve a) and DP-411 (curve b). DP-410 and DP-411 are additional resists that are used for purposes of reference.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a high density pattern of lines, comprising the steps of:

providing a semiconductor surface;

forming a layer of conductive material over said semiconductor surface, a high density pattern of lines to be formed using said layer of conductive material, said high density pattern of lines having a first line pitch and a first line width;

depositing a layer of photoresist over said layer of conductive material;

providing an alternate phase shift mask having opaque lines with a second line pitch that equals said first line pitch, with a second line width that is less than said first line width;

using said alternate phase shift mask and photolithographic processes to form a pattern of photoresist comprising lines having a width being equal to said second width;

increasing the second width of said lines comprising said pattern of photoresist; and forming a high density pattern of lines in said layer of conductive material using said lines formed in said layer of photoresist as a mask.

2. The method of claim 1 whereby said alternate phase shift mask is a photolithographic mask with a ratio of line width to line spacing of between about 0.20 and 0.60 and a line pitch between about 0.20 $\mu$m and 0.40 $\mu$m.

3. The method of claim 1 wherein said layer of conductive material contains a material selected from the group consisting of aluminum and tungsten and titanium nitride and molybdenum and silicides and polysilicon and copper.

4. The method of claim 1 wherein said semiconductor surface is a surface selected from the group consisting of a silicon semiconductor substrate and a layer of dielectric material and a layer of insulating material and a layer of passivation material that can be used as an underlying layer for creation of interconnect metal.

5. The method of claim 1 wherein said increasing the width of said photoresist lines comprises the steps of:

depositing a layer of photoresist reflow material over said patterned layer of photoresist thereby including said lines created in said patterned layer of photoresist, said photoresist reflow material thermally interacting with said patterned layer of photoresist; and subjecting said layer of photoresist reflow material and said patterned layer of photoresist to a process of photoresist reflow material flow, creating a cross linking layer of said patterned layer of photoresist.

6. The method of claim 5 with the additional step of removing unreacted photoresist reflow material from said semiconductor surface.

7. The method of claim 1 wherein said expanding the width of said photoresist lines comprises the steps of:

depositing a layer of photo-sensitive material over a surface of said patterned layer of photoresist material thereby including said lines created in said patterned layer of photoresist, said deposited layer of photo-sensitive material thermally interacting with said patterned layer of photoresist; and subjecting said layer of deposited photo-sensitive material and said patterned layer of photoresist to a process of thermal flow, thereby creating unreacted photo-reflow material, creating a cross linking layer between said deposited layer of photo-sensitive material and said patterned layer of photoresist.

8. The method of claim 7 with the additional step of removing unreacted photo-reflow material from said semiconductor surface.

9. A method of creating high density patterns of lines, comprising the steps of:

provinding a semiconductor surface for creation of conducting lines over its surface over which a layer of conductive material has been deposited, said conductive material containing a material selected from the group consisting of aluminum and tungsten and titanium nitride and molybdenum and suicides and polysilicon and wolfram and copper;

depositing a layer of photo-sensitive material over a surface of said layer of conductive material;

patterning and etching said layer of photo-sensitive material using an alternate phase shift mask thereby creating trenches in said layer of photo-sensitive material, thereby furthermore creating a patterned layer of photo-sensitive material;

depositing a layer of thermal-reflow material over a surface of said patterned layer of photo-sensitive material thereby including said trenches created in said patterned layer of photo-sensitive material whereby said thermal-reflow material has as characteristic that it can thermally interact with said patterned layer of photo-sensitive material; and subjecting said layer of thermal-reflow material and said patterned layer of photo-sensitive material to a process of thermal flow thereby causing a thermal reflow of said patterned layer of photo-sensitive material, thereby creating unreacted photo-reflow material, thereby reducing the critical dimensions of said trenches created in said patterned layer of photo-sensitive material.

10. The method of claim 9 wherein said alternate phase shift mask is a photolithographic mask with a ratio of line-width to line spacing of between about 0.20 and 0.60 and a line pitch between about 0.20 $\mu$m and 0.40 $\mu$m.

11. The method of claim 9 with the additional step of removing unreacted photo-reflow material from said semiconductor surface.

12. A method of creating high density patterns of lines, comprising the steps of:

providing a semiconductor surface that is suitable for creation of conductive lines on its surface over which a layer of conductive material has been deposited comprising a material selected from the group consisting of aluminum and tungsten and titanium nitride and molybdenum and suicides and polysilicon and copper;

depositing a layer of patterning material over said semiconductor surface;

patterning said layer of patterning material using an alternate phase shift mask, creating trenches in said layer of patterning material that penetrate to the surface of said layer of conductive material, creating a patterned layer of patterning material;

coating a layer of photoresist reflow material over the surface of said patterned layer of patterning material thereby including said trenches created in said patterned layer of patterning material whereby said photoresist reflow material has as characteristic that it can chemically interact with said patterned layer of patterning material; and subjecting said layer of photoresist reflow material and said patterned layer of patterning material to a process of cross linking thereby causing a thermal surface cross linking between said layer of photoresist reflow and said patterned layer of patterning material thereby reducing the critical dimensions of said trenches created in said patterned layer of patterning material.

13. The method of claim 12 wherein said alternate phase shift mask is a photolithographic mask with a ratio of line-width to line spacing of between about 0.20 and 0.60 and a line pitch between about 0.20 $\mu$m and 0.40 $\mu$m.

14. The method of claim 12 with the additional step of removing unreacted photoresist reflow material from said semiconductor surface.

15. A method of creating high density patterns of lines, comprising the steps of:

providing a semiconductor surface that is suitable for creation of conductive lines on its surface over which a layer of conductive material has been deposited comprising a material selected from the group consisting of aluminum, tungsten, titanium nitride, molybdenum, silicides and polysilicon and copper has been deposited;

depositing a layer of patterning material over said semiconductor surface;

patterning said layer of patterning material using an Alternate Phase Shift Mask, creating trenches in said layer of patterning material that penetrate to the surface of said layer of conductive material, creating a patterned layer of patterning material;

coating a layer of photo-sensitive material over the surface of said patterned layer of patterning material thereby including said trenches created in said patterned layer of patterning material whereby said layer of photo-sensitive material has as characteristic that it can chemically interact with said patterned layer of patterning material; and subjecting said layer of photo-sensitive material and said patterned layer of patterning material to a process of cross linking, thereby creating unreacted photo-reflow material, thereby causing a thermal surface cross linking between said layer of photo-sensitive material and said patterned layer of patterning material thereby reducing the critical dimensions of said trenches created in said patterned layer of patterning material.

16. The method of claim 15 wherein said alternate phase shift mask is a photolithographic mask with a ratio of line-width to line spacing of between about 0.20 and 0.60 and a line pitch between-about 0.20 $\mu$m and 0.40 $\mu$m.

17. The method of claim 15 with the additional step of removing unreacted photo-reflow material from said semiconductor surface.

* * * * *